(12) United States Patent
Sun et al.

(10) Patent No.: US 7,928,482 B2
(45) Date of Patent: Apr. 19, 2011

(54) GATE STRUCTURE

(75) Inventors: Min-Chul Sun, Hwaseong-si (KR);
Jong-Pyo Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/384,274

(22) Filed: Apr. 2, 2009

(65) Prior Publication Data
US 2009/0250774 A1    Oct. 8, 2009

(30) Foreign Application Priority Data

Apr. 8, 2008    (KR) .................. 10-2008-0032595

(51) Int. Cl.
*H01L 29/76* (2006.01)

(52) U.S. Cl. ........ 257/288; 257/412; 257/413; 257/900; 257/E29.135

(58) Field of Classification Search .................. 257/288, 257/412, 413, 900, E29.134, E29.135, E29.161, 257/E21.199, E21.2, E21.438, E21.439, E21.622, 257/E21.624, E21.636, E21.205, E21.626, E21.64

See application file for complete search history.

(56) References Cited

U.S. PATENT DOCUMENTS

| 6,566,236 | B1 | 5/2003 | Syau et al. | |
| 2004/0129959 | A1* | 7/2004 | Kim et al. | 257/288 |
| 2004/0150048 | A1* | 8/2004 | Usui et al. | 257/355 |
| 2006/0030091 | A1* | 2/2006 | Kuan et al. | 438/195 |

FOREIGN PATENT DOCUMENTS

KR    1019990024350 A    4/1999

* cited by examiner

*Primary Examiner* — Minh-Loan T Tran
*Assistant Examiner* — Leslie Pilar Cruz
(74) *Attorney, Agent, or Firm* — Mills & Onello, LLP

(57) ABSTRACT

A gate structure includes a gate insulation layer pattern, a gate electrode, a first spacer and a protecting layer pattern. The gate insulation layer pattern is on a substrate. The gate electrode is on the gate insulation layer pattern, the gate electrode including a lower portion having a first width, a central portion having a second width smaller than the first width and an upper portion having a third width. The first spacer is on a lower sidewall of the gate electrode. The protecting layer pattern is on a central sidewall of the gate electrode.

4 Claims, 11 Drawing Sheets

GATE STRUCTURE

BACKGROUND

1. Field

Example embodiments relate to a gate structure, a method of forming a gate structure and a method of manufacturing a semiconductor device including a gate structure. More particularly, example embodiments relate to a gate structure including an upper portion having a width smaller than that of a lower portion, a method of forming the gate structure and a method of manufacturing a semiconductor device including the gate structure.

2. Description of the Related Art

Generally, a contact structure such as a contact plug penetrates an insulation interlayer interposed between a lower conductor and an upper conductor to electrically connect the lower and upper conductors to each other.

As the degree of integration of semiconductor devices continues to increase, the interconnect wiring width and or the spacing between the wirings becomes smaller. Thus, the spacing margin between the wiring and any contact plugs positioned between neighboring wiring segments is decreased.

As the distance between gate electrodes of a semiconductor device is decreased, the distance between a neighboring contact plug and a gate electrode is also decreased, and thus the problem of electrical shorting between the contact plug and the gate electrode is more likely to occur. In particular, contact plugs tend to widen at their upper portions. In this case, the width of an upper portion of the contact plug is greater than that of a lower portion of the contact plug, with the lower portion being connected to an impurity region formed in the substrate adjacent a gate electrode. Accordingly, an upper portion of the nearby gate electrode can inadvertently make contact with the neighboring contact plug more often than a lower portion of the gate electrode, causing a shorting problem.

SUMMARY

Example embodiments provide a gate structure capable of preventing an electrical short between a contact plug and a neighboring gate electrode and a method of forming the gate structure.

Example embodiments provide a semiconductor device including the gate structure and a method of manufacturing the semiconductor device.

According to an aspect of example embodiments, a gate structure includes a gate insulation layer pattern, a gate electrode, a first spacer and a protecting layer pattern. The gate insulation layer pattern is on a substrate. The gate electrode is on the gate insulation layer pattern, the gate electrode including a lower portion having a first width, a central portion having a second width smaller than the first width and an upper portion having a third width. The first spacer is on a lower sidewall of the gate electrode. The protecting layer pattern is on a central sidewall of the gate electrode.

In an example embodiment, the gate electrode can be partially oxidized to form the protecting layer pattern. The upper portion and the central portion of the gate electrode can include silicon, and the protecting layer pattern can include silicon oxide.

In some example embodiments, the third width of the upper portion of the gate electrode can be substantially smaller than the first width, and the third width can be substantially the same as or substantially similar to the second width.

In other example embodiments, the third width of the upper portion of the gate electrode can be substantially smaller than the first width, and the third width can be substantially greater than the second width. The gate structure can further include a metal silicide pattern enclosing the upper portion of the gate electrode.

In an example embodiment, the gate structure can further include a second spacer on the first spacer and the protecting layer pattern.

According to another aspect of example embodiments, there is provided a method of forming a gate structure. In the method of forming the gate structure, a gate insulation layer pattern is formed on a substrate. A preliminary gate electrode is formed on the gate insulation layer pattern. A first spacer is formed on a lower sidewall of the preliminary gate electrode. A portion of the preliminary gate electrode exposed by the first spacer is partially oxidized to form a protecting layer so that the preliminary gate electrode is changed into a gate electrode including a lower portion having a first width and an upper portion having a second width. The protecting layer is partially removed to form a protecting layer pattern on a central sidewall of the gate electrode.

In an example embodiment, an upper portion and a central portion of the preliminary gate electrode can include silicon, and the protecting layer can include silicon oxide.

In an example embodiment, the protecting layer can be formed by a thermal oxidation process or a plasma oxidation process.

In an example embodiment, forming the protecting layer pattern can include forming a second spacer on the first spacer and a sidewall of the protecting layer, and partially removing the protecting layer exposed by the second spacer.

In an example embodiment, the protecting layer can be removed by a wet etching process to form the protecting layer pattern.

In an example embodiment, the method can further include forming a metal silicide pattern in the upper portion of the gate electrode. Forming the metal silicide pattern can include forming a metal layer on the gate electrode and the substrate, thermally treating the metal layer to form a metal silicide layer on the substrate and the gate electrode, and removing unreacted metal layer.

According to still another aspect of example embodiments, there is provided a method of manufacturing a semiconductor device. In the method of manufacturing the semiconductor device, a gate insulation layer pattern is formed on a substrate. A preliminary gate electrode is formed on the gate insulation layer pattern. A first spacer is formed on a lower sidewall of the preliminary gate electrode. A portion of the preliminary gate electrode exposed by the first spacer is partially oxidized to form a protecting layer so that the preliminary gate electrode is changed into a gate electrode including a lower portion having a first width and an upper portion having a second width. An impurity region is formed in the substrate adjacent to the gate electrode. The protecting layer is partially removed to form a protecting layer pattern on a central sidewall of the gate electrode. An insulation interlayer is formed on the substrate to cover the gate electrode. A plug is formed to penetrate the insulation interlayer and is connected to the impurity region.

In an example embodiment, an upper portion and a central portion of the preliminary gate electrode can include silicon, and the protecting layer can include silicon oxide.

In an example embodiment, the protecting layer can be formed by a thermal oxidation process or a plasma oxidation process.

In an example embodiment, forming the protecting layer pattern can include forming a second spacer on the first spacer and a sidewall of the protecting layer, and partially removing the protecting layer exposed by the second spacer.

In an example embodiment, the method can further include forming a metal silicide pattern in the upper portion of the gate electrode.

In an example embodiment, the method can further include forming an etch stop layer on the gate electrode before forming the insulation interlayer.

According to example embodiments, because a gate electrode is provided where the upper portion of the gate electrode has a width that is smaller than the lower portion of the gate electrode, and because the protecting layer pattern is formed on the central sidewall of the gate electrode, even in cases where the contact or the plug is positioned between the gate electrodes that are spaced apart from each other by a reduced distance due to the reduction of the fabrication design rule, the plug can be prevented from contacting the gate electrode, to thereby improve the resulting reliability of a semiconductor device that includes the gate electrode and the plug.

BRIEF DESCRIPTION OF THE DRAWINGS

Example embodiments will be more clearly understood from the following detailed description taken in conjunction with the accompanying drawings.

DESCRIPTION OF EMBODIMENTS

Figure 1:
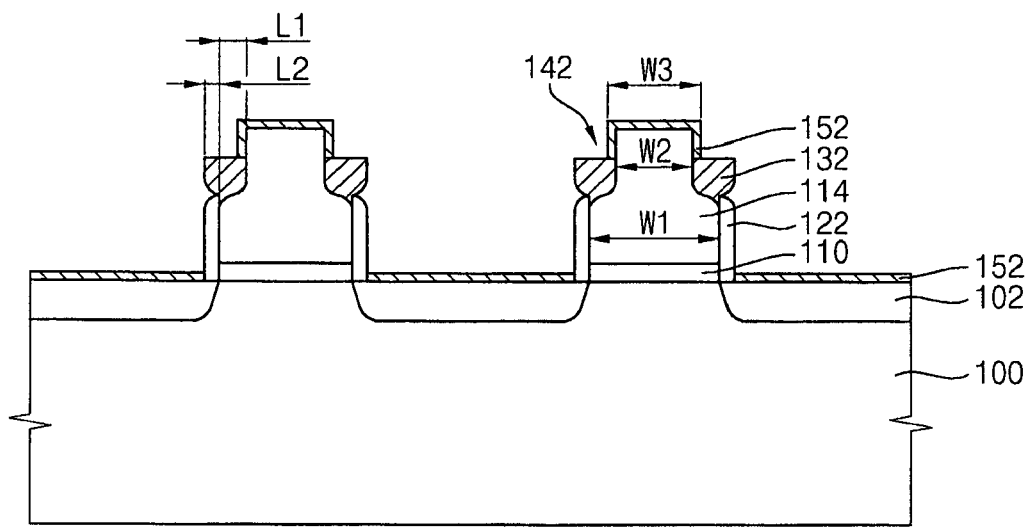
FIG. 1 is a cross-sectional view illustrating a gate structure in accordance with example embodiments.

This application claims priority under 35 U.S.C. §119 to Korean Patent Application No. 2008-32595, filed on Apr. 8, 2008 in the Korean Intellectual Property Office (KIPO), the contents of which are herein incorporated by reference in their entirety.

Various example embodiments will be described more fully hereinafter with reference to the accompanying drawings, in which some example embodiments are shown. The invention may, however, be embodied in many different forms and should not be construed as limited to the example embodiments set forth herein. Rather, these example embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a gate structure in accordance with example embodiments.

Referring to FIG. 1, a gate structure 142 includes a gate insulation layer pattern 110 formed on a substrate 100, a gate electrode 114 on the gate insulation layer pattern 110, a first spacer 122 on a lower sidewall of the gate electrode 114, and a protecting layer pattern 132 on a central sidewall of the gate electrode 114.

In example embodiments, the substrate 100 can include a semiconductor substrate such as a silicon substrate, a germanium substrate, a silicon-germanium substrate, a silicon-on-insulator (SOI) substrate, a germanium-on-insulator (GOI) substrate, and other suitable substrates.

The gate insulation layer pattern 110 is provided on the substrate. The gate electrode 114 is formed on the gate insulation layer pattern 110. In an example embodiment, the gate insulation layer pattern 110 can include an oxide such as silicon oxide, and the gate electrode 114 can include doped polysilicon.

In some example embodiments, the gate electrode can have a multi-layered structure where a metal layer pattern (not illustrated) and a doped polysilicon pattern (not illustrated) are sequentially formed on the gate insulation layer pattern 110. For example, the metal layer pattern can include titanium (Ti), tungsten (W), tantalum (Ta), rubidium (Rb), tantalum nitride (TaNx), tungsten nitride (WNx), titanium nitride (TiNx), hafnium nitride (HfNx), hafnium silicon nitride (HfSixNy), titanium silicon nitride (TiSixNy), tantalum silicon nitride (TaSixNy), hafnium aluminum nitride (HaAlxNy), etc. The metal layer pattern can reduce a depletion effect due to impurities of the polysilicon layer pattern from occurring. In an example embodiment, at least the central portion and an upper portion of the gate electrode 114 can include silicon.

The first spacer 122 is positioned on the lower sidewall of the gate electrode 114. The first spacer 122 covers only a sidewall of the gate electrode 122. A central portion of the gate electrode 114 is covered by the protecting layer pattern 132. The spacer 122 can include, for example, an insulative material such as oxide or nitride. For example, the first spacer 122 can include silicon oxide or silicon nitride.

The protecting layer pattern 132 is positioned on a central portion of the sidewall of the gate electrode 114. In an example embodiment, the protecting layer pattern 132 can include an oxide such as silicon oxide. The central portion of the gate electrode 114 exposed by the first spacer 122 can be subject to thermal oxidation to form the protecting layer pattern 132. For example, the central portion of the gate electrode 114 exposed by the first spacer 122 can be selectively oxidized by a thermal oxidation process or a plasma oxidation process, to form the protecting layer pattern 132. That is, the central portion of the gate electrode 114 including silicon can be partially oxidized to form the protecting layer pattern 132 including silicon oxide through a selective oxidation process.

In example embodiments, by a selective oxidation process, the protecting layer pattern 132 can be grown to have a first width (L1) inward with respect to the lower sidewall of the gate electrode 114 and a second width (L2) outward with respect to the lower sidewall of the gate electrode 114. Here, a ratio between the first width (L1) and the second width (L2) can be in a range of about 1.0.0.6 to about 1.0:0.9. For example, when the first width (L1) is about 5 mm, the second width (L2) is about 3 nm. By forming the protecting layer pattern 132, a lower portion of the gate electrode 114 can have a first width (W1) and the central portion of the gate electrode 114 can have a second width (W2) substantially smaller than the first width (W1). The difference between the first width (W1) and the second width (W2) of the gate electrode 114 can correspond to the first width (L1) of the protecting layer pattern 132.

In example embodiments, a metal silicide pattern 152 is formed on the upper portion of the gate electrode 114 exposed by forming the protecting layer pattern 132. The metal silicide pattern can be formed on an upper surface and an upper sidewall of the gate electrode 114 to improve electrical properties of the gate electrode 114. The metal silicide pattern 152 can include a metal having a high melting point. Examples of the metal can include cobalt (Co), nickel (Ni), platinum (Pt), palladium (Pd), titanium (Ti), and other suitable metal materials.

In some example embodiments, the gate electrode 114 can include the lower portion having the first width (W1), the central portion having the second width (W2) smaller than the first width (W1) and the upper portion having a third width (W3). Here, the third width (W3) of the upper portion of the gate electrode 114 can be substantially smaller than the first width (W1) and can be substantially the same as, or substantially greater than, the second width (W2). For example, when the metal silicide pattern 152 is formed, the third width (W3) of the upper portion of the gate electrode 114 can be substantially greater than the second width (W2).

In example embodiments, an impurity region 102 can be formed in substrate 100 adjacent to the gate electrode 114 by an ion implantation process. The metal silicide pattern can further be formed on the impurity region 102 to reduce contact resistance between the impurity region 102 and a contact or a plug (not illustrated).

Figure 2:
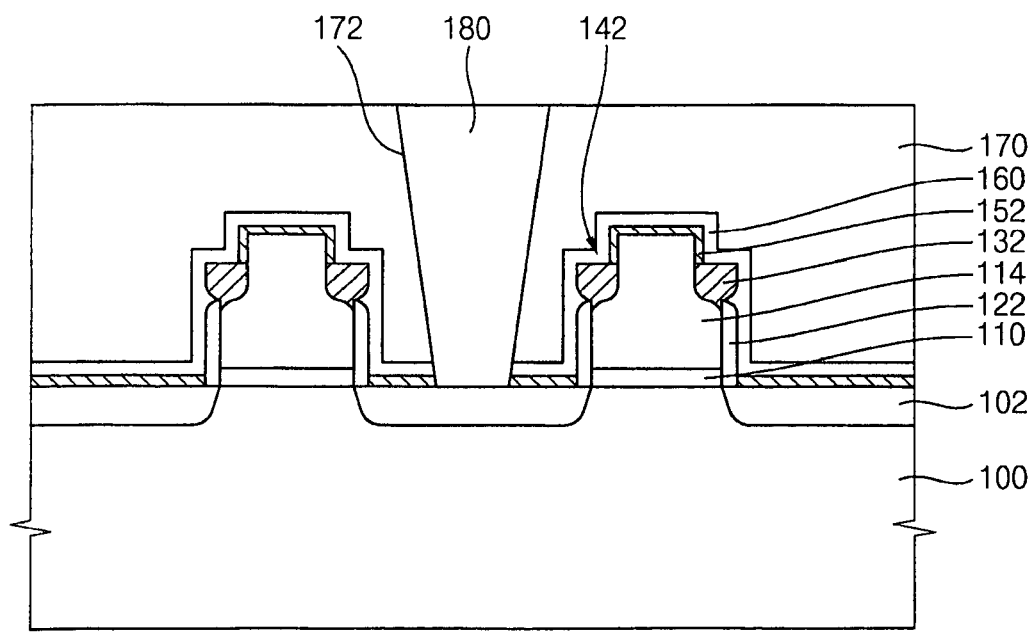
FIG. 2 is a cross-sectional view illustrating a semiconductor device including a gate structure in accordance with example embodiments.

FIG. 2 is a cross-sectional view illustrating a semiconductor device including a gate structure in accordance with example embodiments.

Referring to FIG. 2, a semiconductor device 190 includes a gate structure having a gate electrode 114, an impurity region 102 formed in a substrate 100 adjacent to the gate electrode 114, an insulation interlayer 170 formed on the substrate 100 to cover the gate structure 142, and a contact or a plug 180 penetrating the insulation interlayer 170 to be connected to the impurity region 102. In the semiconductor device 190 as illustrated in FIG. 2, the gate structure 142 can have a construction substantially the same or substantially similar to that described above with reference to FIG. 1.

The impurity region 102 is formed under a surface of the substrate 100 adjacent to the gate electrode 114. The impurity region 102 can include N type or P type impurities according to the desired type of semiconductor device 190.

In example embodiments, a metal silicide pattern 152 can be formed on the impurity region 102. An etch stop layer 160 can be further formed on the substrate 100 to cover the gate structure 142. The etch stop layer 160 can include nitride or oxynitride. For example, the etch stop layer 160 can include silicon nitride or silicon oxynitride.

The insulation interlayer 170 is formed on the substrate 100 to have a sufficient height such that the gate structure 142 is sufficiently covered with the insulation interlayer 170. For example, the insulation interlayer 170 can include an insulative material containing oxide such as BPSG, PSG, USG, SOG, FOX, TOSZ, BPSG, PSG, TEOS, PE-TEOS, and other materials suitable for this purpose.

A contact hole 172 is formed in the insulation interlayer 170 to expose the impurity region 102 adjacent to the gate structure 142. The contact hole 172 can be formed, for example, by a photolithography process. In an example embodiment, an upper portion of the contact hole 172 can have a width greater than that of a lower portion of the contact hole 172.

The contact or the plug 180 is formed in the contact hole 172. The plug 180 is connected to the impurity region 180, to electrically connect the impurity region 102 to a pad or wiring (not illustrated) formed on, or otherwise connected to an upper surface of, the plug 180. An upper portion of the plug 180 can have a width greater than that of a lower portion of the plug 180 according to the shape of the contact hole 172.

As described above, because the upper portion of the gate electrode 114 has a width substantially smaller than that of the lower portion of the gate electrode 114, even in situations where the gate electrodes 114 are formed relatively close to each other, the upper portions of the adjacent gate electrodes 114 can be sufficiently spaced apart from one another. That is, even though the semiconductor device is manufactured under a relatively fine design rule, the upper portions of the adjacent gate electrodes 114 can be sufficiently spaced apart from one another by a suitable distance. Further, because the protecting layer pattern 132 covers the central portion of the gate electrode 114, a shorting failure between the gate electrode 114 and the plug 180 formed between the adjacent gate electrodes 114 can be prevented.

FIGS. 3 to 9 are cross-sectional views illustrating a method of forming a gate structure in accordance with example embodiments.

Figure 3:
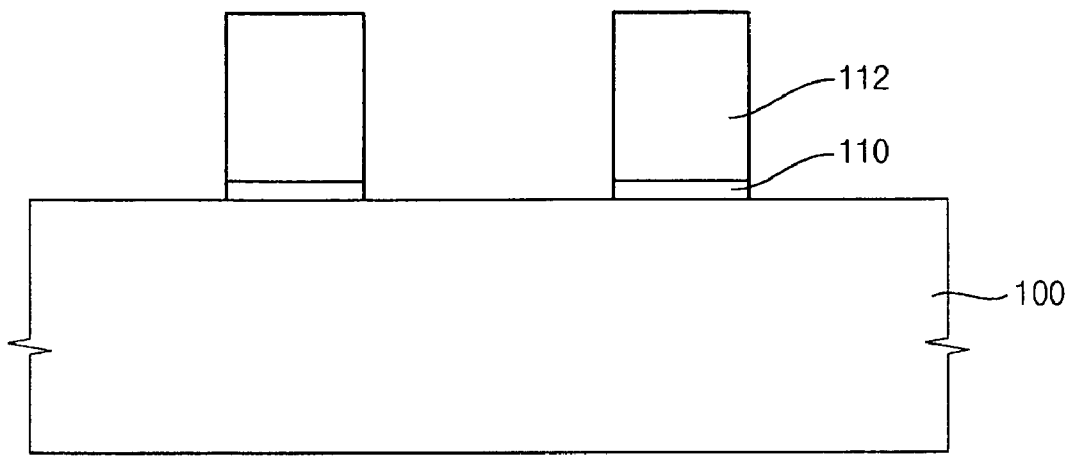
FIGS. 3 to 9 are cross-sectional views illustrating a method of forming a gate structure in accordance with example embodiments.

Referring to FIG. 3, a gate insulation layer pattern 110 and a preliminary gate electrode 112 are formed on a substrate 100. For example, the substrate 100 can include a silicon substrate, a SOI substrate, a germanium substrate, a GOI substrate, a silicon-germanium substrate, and other types of substrate materials. An isolation layer (not illustrated) can be formed in the substrate 100 to define an active region and a field region. In this case, the isolation layer can be formed using an insulative oxide, such as silicon oxide.

In example embodiments, after a gate insulation layer (not illustrated) and a gate conductive layer (not illustrated) are sequentially formed on the substrate 100, the gate insulation layer and the gate conductive layer are patterned to form the gate insulation layer pattern 110 and the preliminary gate electrode 112. The gate insulation layer pattern 110 and the preliminary gate electrode 112 can be formed using a photoresist pattern or a hard mask pattern as an etching mask pattern. The gate insulation layer can include silicon oxide. The gate insulation layer can be formed by a thermal oxidation process or a chemical vapor deposition process. The gate conductive layer can be formed using a material including silicon. For example, after a polysilicon layer is formed on the gate insulation layer, impurities are implanted into the polysilicon layer to form the gate conductive layer. Alternatively, the gate conductive layer can include a metal layer and a doped polysilicon layer. Accordingly, at least an upper portion and a central portion of the preliminary gate electrode 112 can include silicon.

Figure 4:
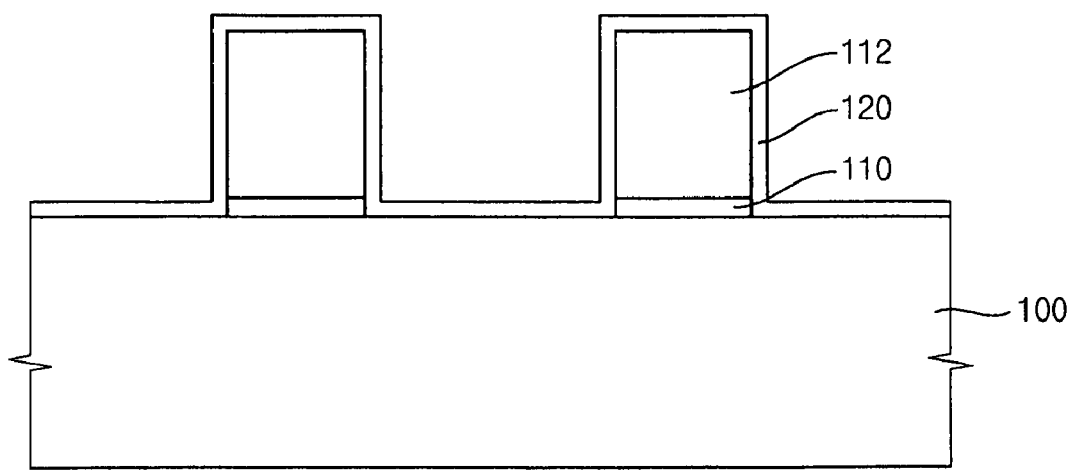

Referring to FIG. 4, a first insulation layer 120 is formed on the substrate 100 and the preliminary gate electrode 112. The first insulation layer 120 is later patterned to form a first spacer 122 (See FIG. 5). The first insulation layer 120 can be formed using nitride or oxynitride. For example, silicon nitride or silicon oxynitride can be deposited on the substrate 100 and the preliminary gate electrode 112 by a chemical vapor deposition process to form the first insulation layer 120.

Figure 5:
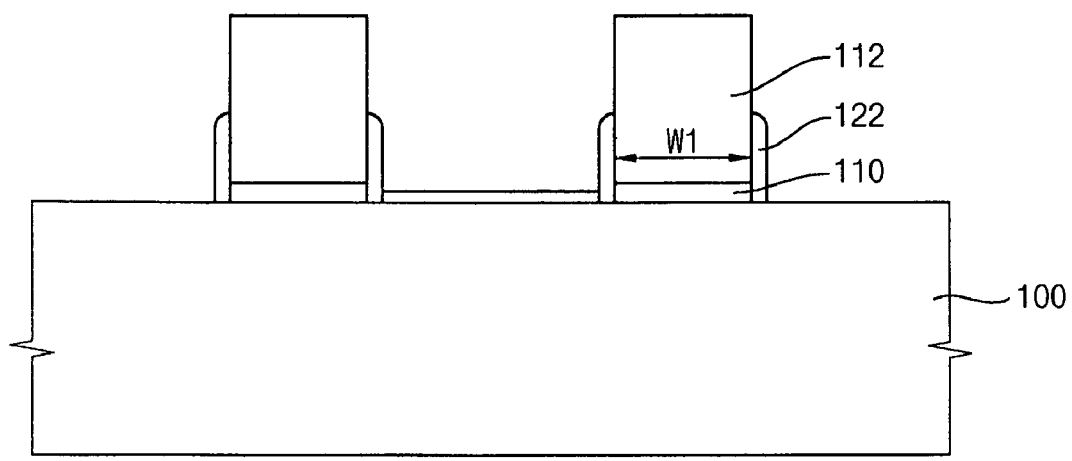

Referring to FIG. 5, the first insulation layer 120 is etched to form a first spacer 122 so that the first spacer remains only on a lower sidewall of the preliminary gate electrode 112. The first spacer 122 can be formed by an anisotropic etching process. By the anisotropic etching process, the first insulation layer 120 on the substrate 100 can be removed to expose the substrate 100 between the preliminary gate electrodes 112.

In example embodiments, as process conditions such as an etching rate, an etching gas or an etching solution and an etching time can be properly controlled, the portions of the first insulation layer 120 positioned on the upper portion and the central portion of the preliminary gate electrode 112 are removed. Thus, the first spacer 122 is formed only on the lower sidewall of the preliminary gate electrode 112, and sidewalls of an upper portion and a lower portion of the preliminary gate electrode 112 are exposed.

Figure 6:
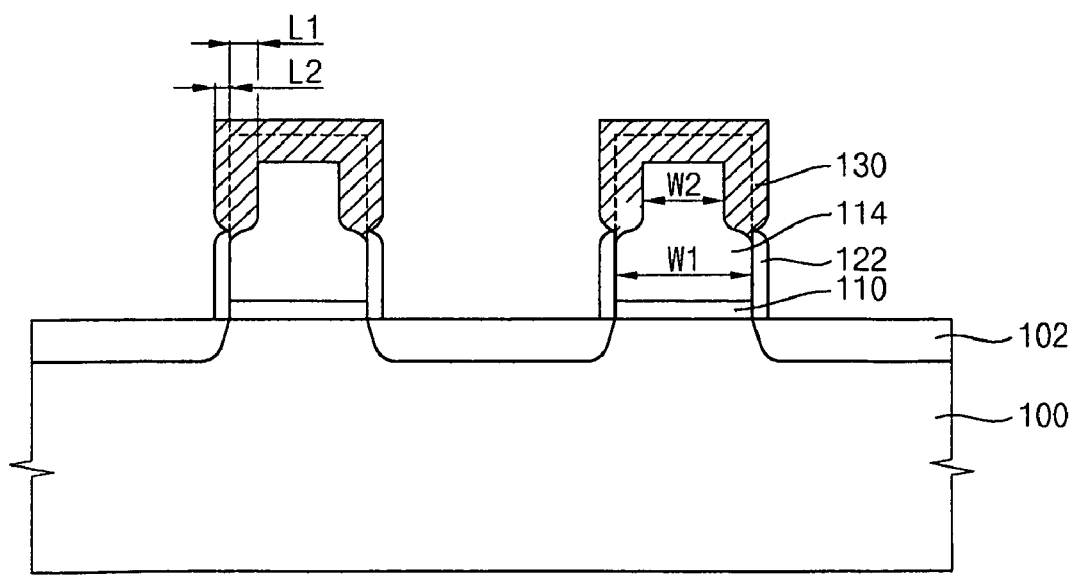

Referring to FIG. 6, the preliminary gate electrode 112 is partially oxidized to form a protecting layer 130 and the preliminary gate electrode 112 is thereby changed in size to form a gate electrode 114.

In example embodiments, the exposed upper and the central portions of the preliminary gate electrode 112 can be selectively oxidized by a thermal oxidation process or a plasma oxidation process. Because the upper and the central portions of the preliminary gate electrode 112 exposed by forming the first spacer 122 include silicon, as the upper and central portions of the preliminary gate electrode 112 are consumed by a selective oxidation process, silicon oxide is grown from the upper and the central portions of the preliminary gate electrode 112 to form the protecting layer 130. Thus, the protecting layer 130 covers an upper portion and a central portion of the gate electrode 114. Silicon oxide can also be grown from the portions of the substrate 100 that are exposed between the preliminary gate electrodes 112 during the selective oxidation process.

In an example embodiment, a thermal oxidation process can be performed under a pressure of about 0.25 Torr to about 2.0 Torr and at a temperature of about 900° C. to about 100° C., to form the protecting layer 130. In this case, the protecting layer 130 can have about 3 nm to about 14 nm.

By the selective oxidation process, the protecting layer 130 is grown to a first width (L1) inward from the former boundary of the preliminary gate electrode 112 and is grown to a second width (L2) outward from the former boundary of the preliminary gate electrode 112. Here, a ratio between the first width (L1) and the second width (L2) can be about 1.0:0.6 to about 1.0:0.9. For example, when the first width (L1) is about 5 nm, the second width (L2) is about 3 nm. By forming the protecting layer 130, the preliminary gate electrode 112 is changed into the gate electrode 114 including a lower portion having a first width (W1) and an upper portion having a second width (W2). In this case, the second width (W2) of the gate electrode 114 can be substantially smaller than the first width (W1) of the gate electrode 114.

As illustrated in FIG. 6, impurities are implanted into the substrate 100 exposed between the gate electrodes 114 to form an impurity region 102. The impurity region 102 can be provided as a source/drain region. In some example embodiments, the impurity region 102 can be formed before the protecting layer 130 is formed. Here, the first spacer 122 can prevent the impurities from diffusing excessively to the substrate 100 under the gate electrode 112.

Figure 7:
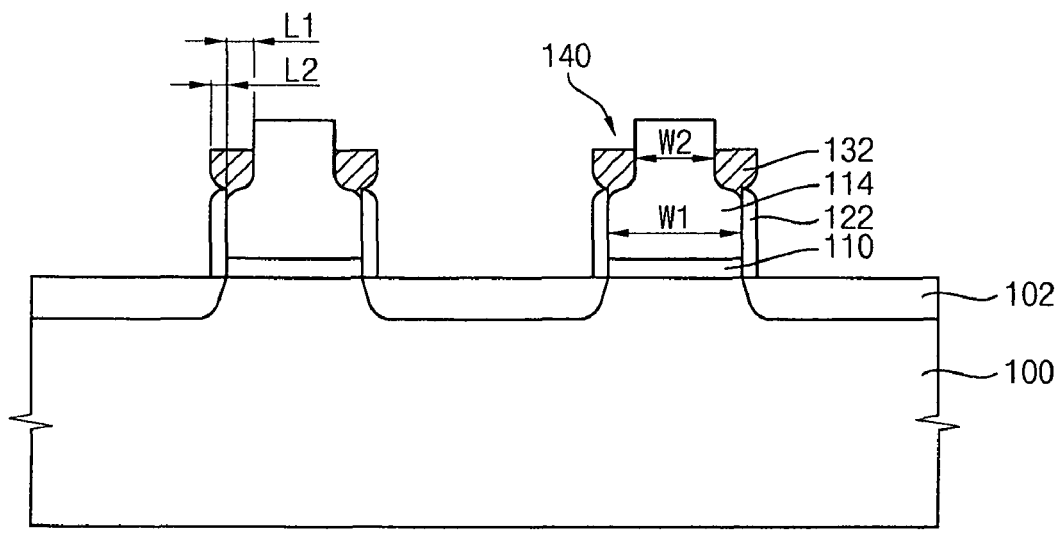

Referring to FIG. 7, the protecting layer 130 is partially removed to form a protecting layer pattern 132 on a central sidewall of the gate electrode 114. The protecting layer pattern 132 can be formed by a wet etching process. For example, the protecting layer 130 can be partially removed using an etching solution including hydrogen fluoride (HF).

By the etching process, the protecting layer pattern 132 is formed on the central sidewall of the gate electrode 114 to expose an upper portion of the gate electrode 114. In this case, silicon oxide that is formed on the substrate 100 between the gate electrodes 114 is removed together by the etching process for forming the protecting layer pattern 132. Thus, a first gate structure 140 including the gate insulation layer pattern 110 on the substrate 100, the gate electrode 114 on the gate insulation layer pattern 110, the first spacer 122 on the lower sidewall of the gate electrode 114 and the protecting layer pattern 132 on the central sidewall of the gate electrode 114 are formed.

Figure 8:
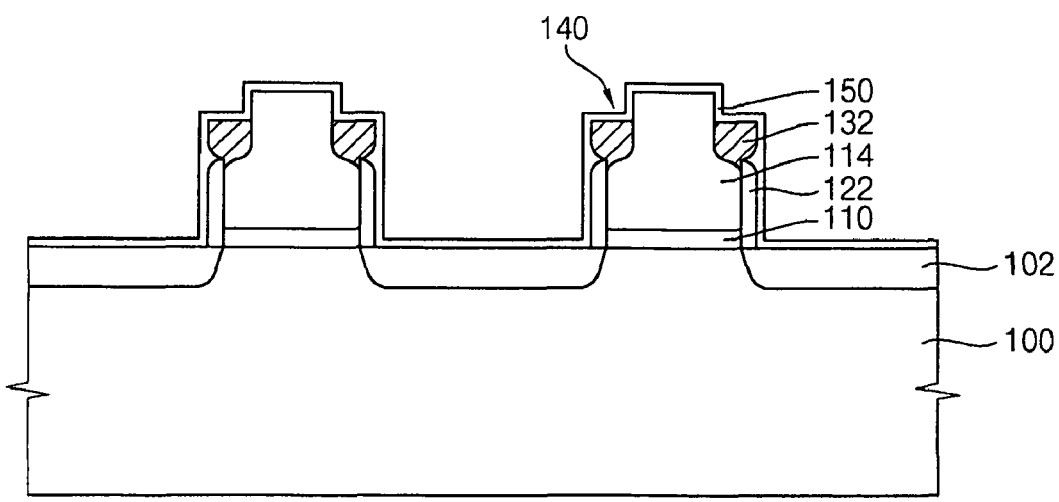

Referring to FIG. 8, a metal layer 150 is formed conformally on the gate electrode 114 and the substrate 100. The metal layer 150 can include a metal having a high melting point. Examples of the metal can include cobalt (Co), nickel (Ni), platinum (Pt), palladium (Pd), titanium (Ti), etc. The metal layer 150 can be formed by a physical vapor deposition (PVD) process, a chemical vapor deposition (CVD) process, an atomic layer deposition (ALD) process, an electroless plating process, and other suitable processes.

In example embodiments, a capping layer (not illustrated) is further formed on the metal layer 150. The capping layer can prevent a surface of the metal layer 150 from oxidizing during a following thermal treatment process. For example, the capping layer can be formed using titanium (Ti) and/or titanium nitride (TiN). In some example embodiments, the process of forming the capping layer can be omitted for simplification.

Figure 9:
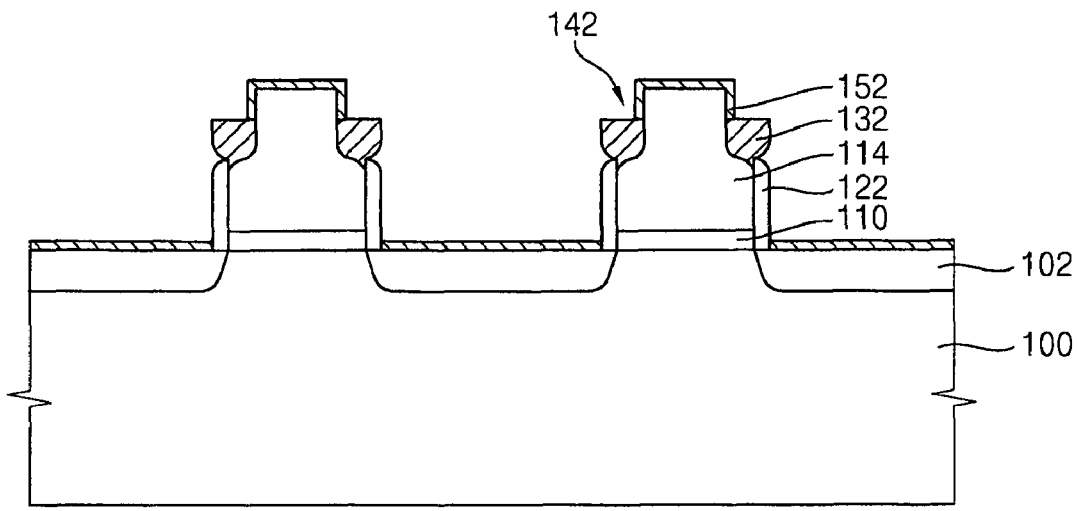

Referring to FIG. 9, the metal layer 150 formed on the substrate 100 is thermally treated to react the metal layer 150 with silicon included in the upper portion of the gate electrode 114. For example, the thermal treatment can include a rapid thermal annealing (RTA) process that is performed under a pressure of about $10^{-8}$ Torr to about 3,000 Torr and at a temperature of about 300° C. to about 1,000° C. During the RTA process, metal of the metal layer 150 reacts with silicon included in the substrate 100 and the upper portion of the gate electrode 114 exposed by the protecting layer pattern 132, to form a metal silicide pattern 152. The metal silicide pattern 152 is formed in the upper portion of the gate electrode 114 and the substrate 100 exposed between the gate electrodes 114. The metal silicide pattern 152 can improve conductivity of the gate electrode 114 and reduce contact resistance between the impurity region 102 and a contact or plug together.

After the thermal treatment, the unreacted metal layer 150 remaining on the first spacer 122 and the protecting layer pattern 132 is removed to complete a metal silicide pattern 152. For example, the remaining metal layer 150 can be removed by a stripping process. However, the process for forming the metal silicide pattern 152 can be omitted for a simplification.

According to example embodiments, a second gate structure 142 including the gate electrode 114 is formed on the substrate 100. The gate electrode 114 includes the lower portion having the first width (W1), the central portion having the second width (W2) substantially smaller than the first width (W1) and the upper portion having a third width (W3). The metal silicide pattern 152 can be formed in the upper portion of the gate electrode 114, the protecting layer pattern 132 is formed on the central sidewall of the gate electrode 114 and the first spacer 122 is formed on the lower sidewall of the gate electrode 114. Here, the third width (W3) of the upper portion of the gate electrode 114 can be smaller than the first width (W1) and can be substantially the same as, or substantially greater than, the second width (W2) of the central portion. For example, when the metal silicide pattern 152 is formed, the third width (W3) of the upper portion of the gate electrode 114 can be substantially greater than the second width (W2).

Figure 10:
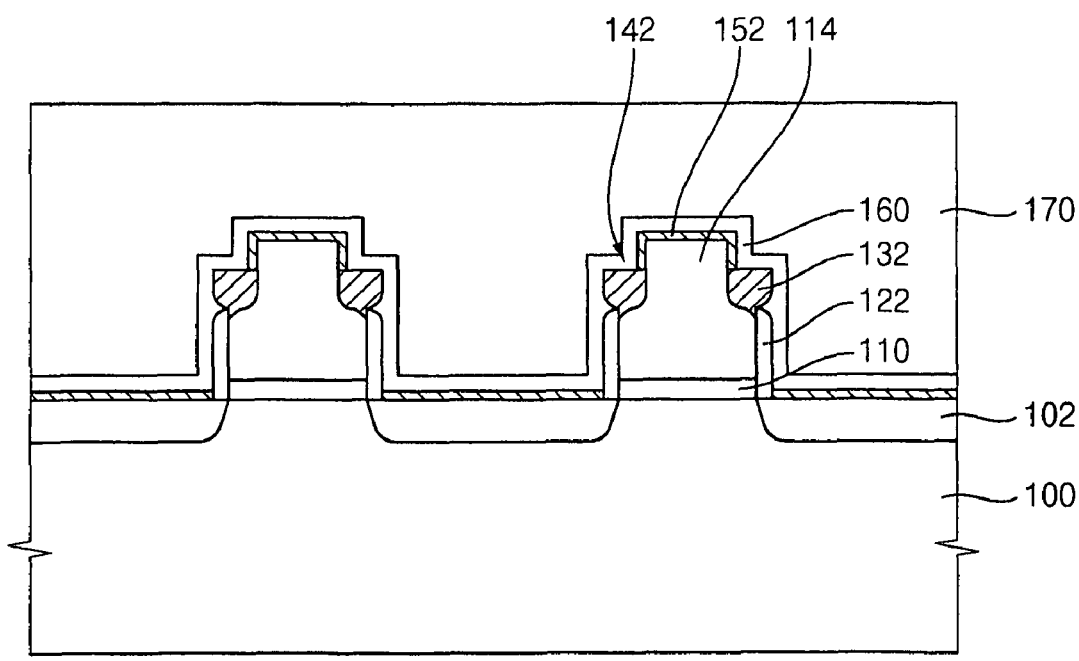
FIGS. 10 and 11 are cross-sectional views illustrating a method of manufacturing a semiconductor device including a gate structure.
Figure 11:
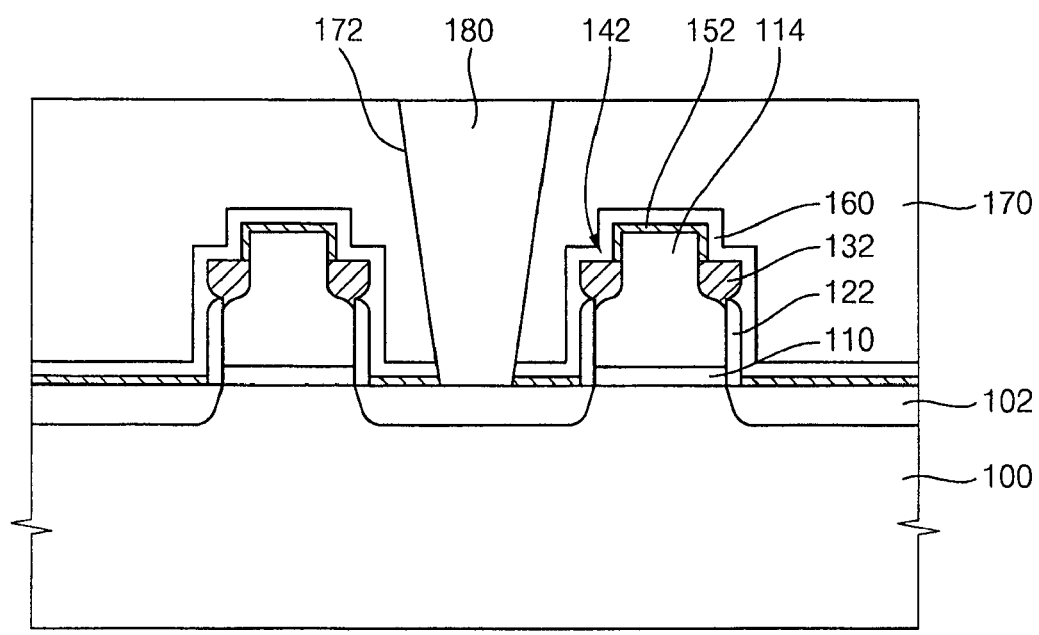

FIGS. 10 and 11 are cross-sectional views illustrating a method of manufacturing a semiconductor device including a gate structure in accordance with example embodiments. In FIGS. 10 and 11, processes of forming the gate structure 142 are substantially the same as or substantially similar to those described with reference to FIGS. 3 to 9.

Referring to FIG. 10, after the second gate structure 142 is formed, an etch stop layer 160 is formed on the second gate structure 142 and the substrate 100. The etch stop layer 160 can be formed using a nitride or an oxynitride by a chemical vapor deposition process. For example, the etch stop layer 142 can include silicon nitride or silicon oxynitride.

An insulation interlayer 170 is formed on the etch stop layer 142 to cover the second gate structures 142, completely filling a gap between the second gate structures 142. The insulation interlayer 170 can be formed, for example, using an oxide such as silicon oxide. In an example embodiment, an upper surface of the insulation interlayer 170 can be planarized by a planarization process. For example, the insulation interlayer 170 can be planarized by a chemical mechanical polishing process and/or an etch-back process.

Referring to FIG. 11, the insulation interlayer 170 is partially etched to form an opening or a contact hole 172 that exposes the metal silicide pattern 152 on the impurity region 102. For example, after a photoresist pattern (not illustrated) is formed on the insulation interlayer 170, the insulation interlayer 170 is etched using the photoresist pattern as an etching mask to form the contact hole 172 that exposes the metal silicide pattern 152 on the impurity region 102. Here, an upper portion of the contact hole 172 can have a width greater than that of a lower portion of the contact hole 172.

A conductive layer (not illustrated) is formed on the insulation interlayer 170 and the exposed metal silicide pattern 152 to fill the contact hole 172. The conductive layer can be formed using doped polysilicon, metal and/or metal compound.

An upper surface of the conductive layer is planarized until the insulation interlayer 170 is exposed, to form a contact or plug 180 that fills the contact hole 172. For example, the plug 180 can be formed by a chemical mechanical polishing process and/or an etch-back process. An upper portion of the plug 180 can have a width greater than that of a lower portion of the plug 180 according to the shape of the contact hole 172. The plug 180 is electrically connected to the impurity region 102 through the metal silicide pattern 152.

In a conventional semiconductor device, a plug that expands in size toward its top portion tends to make contact with the upper portion of the gate electrode, to thereby cause frequent shorting problems between the plug and gate electrode. However, according to example embodiments, because the upper portion of the gate electrode 114 has a width smaller than the lower portion of the gate electrode 114, and because the protecting layer pattern 132 is formed on the central sidewall of the gate electrode 114, even though the plug 180 is positioned between the gate electrodes 114 that are spaced apart from each other by a reduced distance according to a reduction of the fabrication design rule, the plug 180 can be prevented from contacting the gate electrode 114, to thereby improve the resulting reliability of a semiconductor device that includes the gate electrode 114 and the plug 180.

Figure 12:
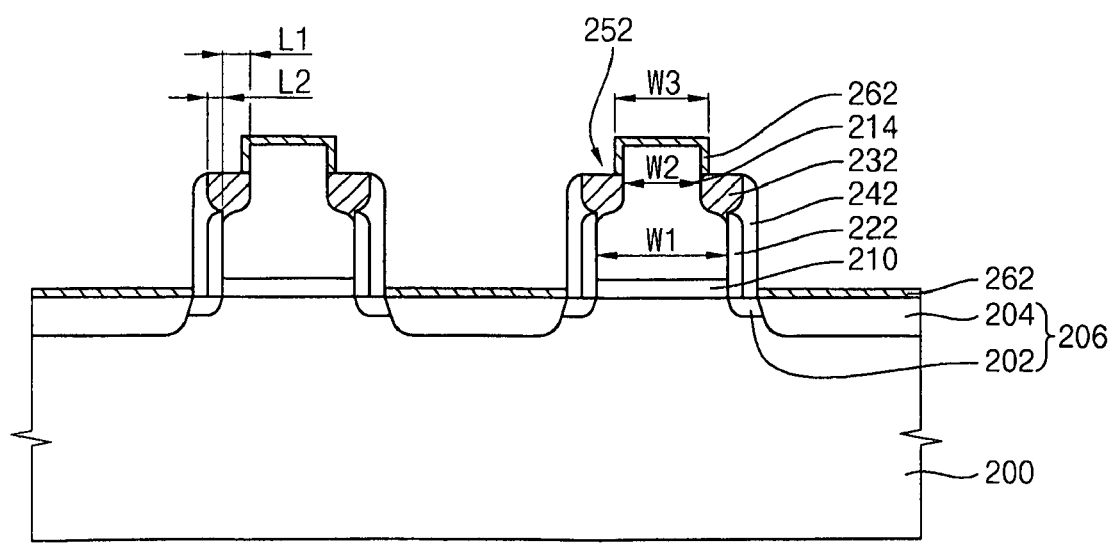
FIG. 12 is a cross-sectional view illustrating a gate structure in accordance with example embodiments.

FIG. 12 is a cross-sectional view illustrating a gate structure in accordance with example embodiments. The gate structure in FIG. 12 is substantially the same as or substantially similar to the gate structure described with reference to FIG. 1, with the exception being that the gate structure in FIG. 12 includes a second spacer adjacent the first spacer and opposite the gate electrode.

Referring to FIG. 12, a gate structure 252 includes a gate insulation layer pattern 210 formed on a substrate 200, a gate electrode 214 on the gate insulation layer pattern 210, a first spacer 222 on a lower sidewall of the gate electrode 214, a protecting layer pattern 232 on a central sidewall of the gate electrode 214, and a second spacer 242 on sidewalls of the first spacer 222 and the protecting layer pattern 232.

The gate electrode 214 is electrically insulated from the substrate 200 by the gate insulation layer pattern 210. The first spacer 222 covers the lower sidewall of the gate electrode 214 and the protecting layer pattern 232 covers the central sidewall of the gate electrode 214. Accordingly, an upper portion of the gate electrode 214 is exposed by the first spacer 222 and the protecting layer pattern 232.

In example embodiments, a portion of the gate electrode 214 exposed by the first spacer 222 can be selectively oxidized to form the protecting layer pattern 232. For example, the protecting layer pattern 232 can be formed by a thermal oxidation process or a plasma oxidation process. Here, as silicon included in the gate electrode 214 is consumed by a selective oxidation process, silicon oxide can be grown to form the protecting layer pattern 232. By the selective oxidation process, the protecting layer pattern 232 can be grown to have a first width (L1) inward wither respect to the lower sidewall of the gate electrode 214 and a second width (L2) outward with respect to the lower sidewall of the gate electrode 214. A ratio between the first width (L1) and the second width (L2) can be about 1.0:0.6 to about 1.0:0.9. For example, when the first width (L1) can be about 5 nm, the second width (L2) can be about 3 nm. By forming the protecting layer pattern 132, a lower portion of the gate electrode 214 can have a first width (W1) and a central portion of the gate electrode 214 can have a second width (W2) substantially smaller than the first width (W1).

As illustrated in FIG. 12, the second spacer 242 is provided on the first spacer 222 and the protecting layer pattern 232. By forming the second spacer 242, an upper surface of the protecting layer pattern 232 and the upper portion of the gate electrode 214 are exposed.

In example embodiments, a metal silicide pattern 262 including a metal having a high melting point can be formed in the upper portion of the gate electrode 214 exposed by forming the second spacer 242. The metal silicide pattern 262 can improve electrical properties of the gate electrode 214. When the metal silicide pattern 262 is formed, the upper portion of the gate electrode 214 can have a width that is substantially smaller than the first width (W1) of the lower portion and that is greater than the second width (W2) of the central portion. Accordingly, the gate electrode 214 can have an upper portion having a width that is substantially smaller than that of the lower portion. That is, the gate electrode 214 can include the lower portion having the first width (W1), the central portion having the second width (W2) substantially smaller than the first width (W2) and the upper portion having a third width (W3). While the third width (W3) of the upper portion of the gate electrode 214 is substantially smaller than the first width (W1) of the lower portion, the third width (W3) of the upper portion of the gate electrode 214 can be substantially smaller or substantially greater than the second width (W2) of the central portion. On the other hand, the third width (W3) of the upper portion of the gate electrode 214 can be substantially the same as the second width (W2) of the central portion. For example, when the metal silicide pattern 262 is formed, the third width (W3) of the upper portion of the gate electrode 214 can be substantially greater than the second width (W2) of the central portion.

Figure 13:
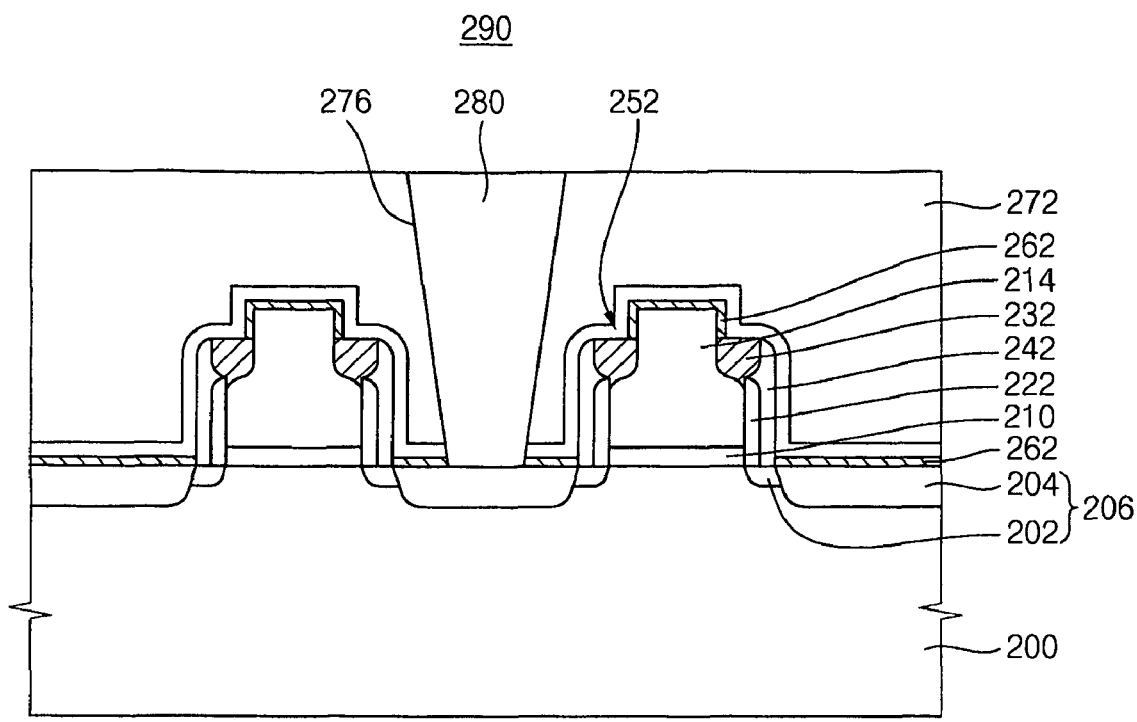
FIG. 13 is a cross-sectional view illustrating a semiconductor device including a gate structure in accordance with example embodiments.

FIG. 13 is a cross-sectional view illustrating a semiconductor device including a gate structure in accordance with example embodiments.

Referring to FIG. 13, a semiconductor device 290 includes a gate structure 252 having a gate electrode 214, an impurity region 206 formed in a substrate 200 adjacent to the gate electrode 214, an insulation interlayer 272 formed on the substrate 200 to cover the gate structure 252, and a contact or plug 280 penetrating the insulation interlayer 272 to be connected to the impurity region 206.

The impurity region 206 is formed in the substrate 200 between the neighboring or adjacent gate electrodes 214. The impurity region 206 can include a first impurity region 202 and a second impurity region 204 to be provided as a source/drain region of a lightly doped drain (LDD) structure. Here, the second impurity region 204 can have an impurity concentration that is substantially greater than that of the first impurity region 202.

The insulation interlayer 272 is formed on the substrate 200 to have a sufficient height such that the gate structure 252 is sufficiently covered with the insulation interlayer 272. A contact hole 276 is formed in the insulation interlayer 272 to selectively expose the substrate 200 between the gate structures 252. For example, an upper portion of the contact hole 276 can have a width substantially greater than that of a lower portion of the contact hole 276. The contact or plug 280 is formed in the contact hole 276 to be connected to the impurity region 206. Here, an upper portion of the plug 280 can have a width substantially greater than that of a lower portion of the plug 280.

In example embodiments, the upper portion of the gate electrode 214 can have a width that is substantially smaller than that of the lower portion of the gate electrode 214, and the protecting layer pattern 232 is formed on the central portion of the gate electrode 214. Therefore, even in situations where the gate electrodes 214 are formed relatively close to each other, a shorting failure between the gate electrode 214 and the plug 280 can be prevented.

FIGS. 14 to 20 are cross-sectional views illustrating a method of forming a gate structure in accordance with example embodiments. In FIGS. 14 to 20, the process of forming the gate structure 252 is substantially the same as or substantially similar to the process described above with reference to FIGS. 3 to 9, with the exception being the steps of forming the impurity region 206 and the second spacer 242.

Figure 14:
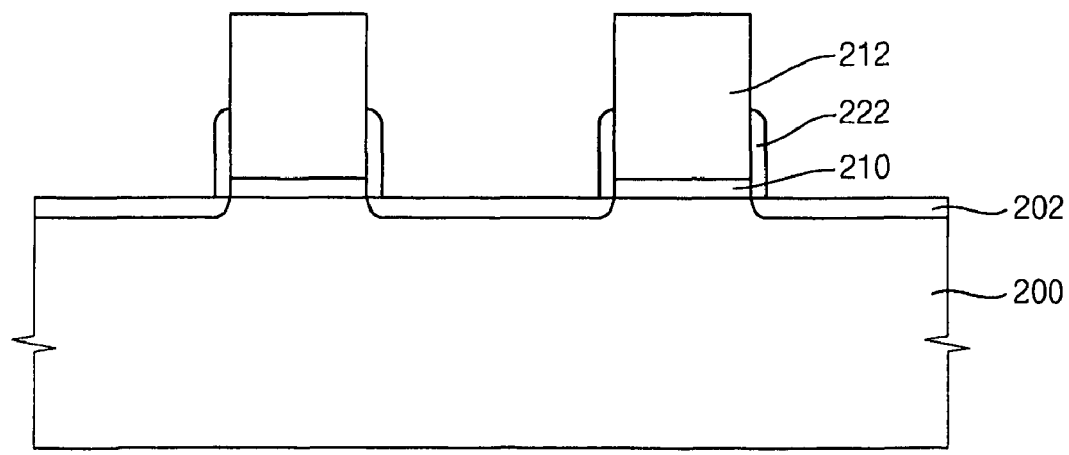
FIGS. 14 to 20 are cross-sectional views illustrating a method of forming a gate structure in accordance with example embodiments.

Referring to FIG. 14, after a first insulation layer (not illustrated) is formed on a substrate on which a gate insulation layer pattern 210 and a preliminary gate electrode 212 are formed, the first insulation layer is partially etched to form a first spacer 222 so that the first spacer remains on only a lower sidewall of the preliminary gate electrode 212.

Impurities are implanted into the portions of the substrate 200 exposed between the neighboring preliminary gate electrodes 212 at a low impurity concentration to form a first impurity region 202. In this case, the first spacer 222 can prevent impurities from diffusing excessively into the substrate 100 under the preliminary gate electrode 212 during the implantation process.

Figure 15:
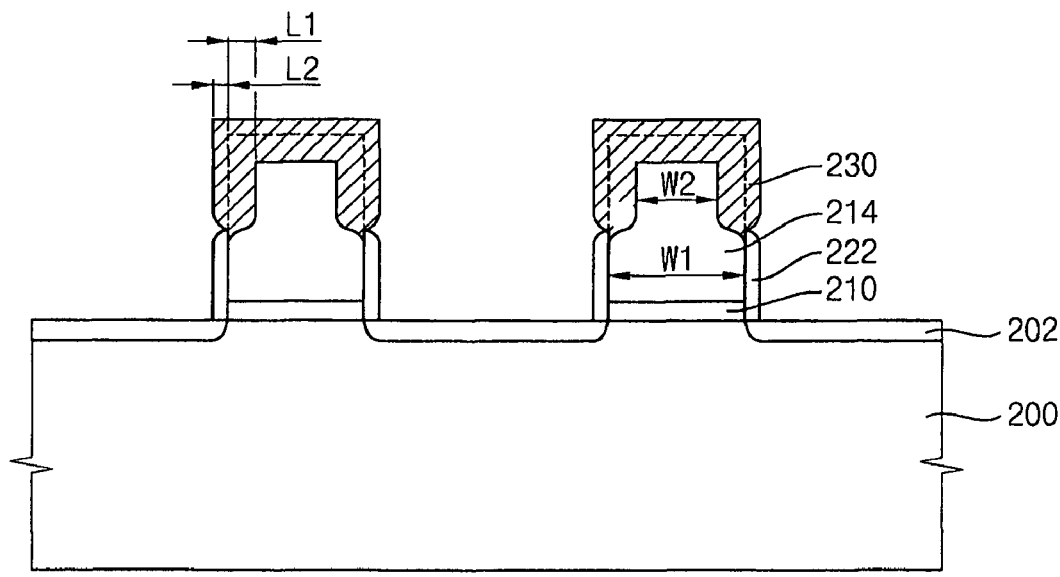

Referring to FIG. 15, a portion of the preliminary gate electrode 212 exposed by the first spacer 222 is selectively oxidized to form a protecting layer 230. For example, the preliminary gate electrode 212 can be partially oxidized by a thermal oxidation process or a plasma oxidation process to form the protecting layer 230. As silicon included in the upper and central portions of the preliminary gate electrode 212 exposed by forming the first spacer 222 are consumed by the selective oxidation process, silicon oxide is grown to form the protecting layer 230. Silicon oxide can also be grown from the portions of the substrate 200 that are exposed between the preliminary gate electrodes 212 during the selective oxidation process.

By the selective oxidation process, the protecting layer 230 is grown to a first width (L1) inward from the former boundary of the preliminary gate electrode 212 and is grown to a second width (L2) outward from the former boundary of the preliminary gate electrode 212. Here, a ratio between the first width (L1) and the second width (L2) can be about 1.0:0.6 to about 1.0:0.9. For example, when the first width (L1) can be about 5 nm, the second width (L2) can be about 3 nm. By forming the protecting layer 230, the preliminary gate electrode 212 is changed into a gate electrode 214 including a lower portion having a first width (W1) and an upper portion having a second width (W2) that can be substantially smaller than the first width (W1).

Figure 16:
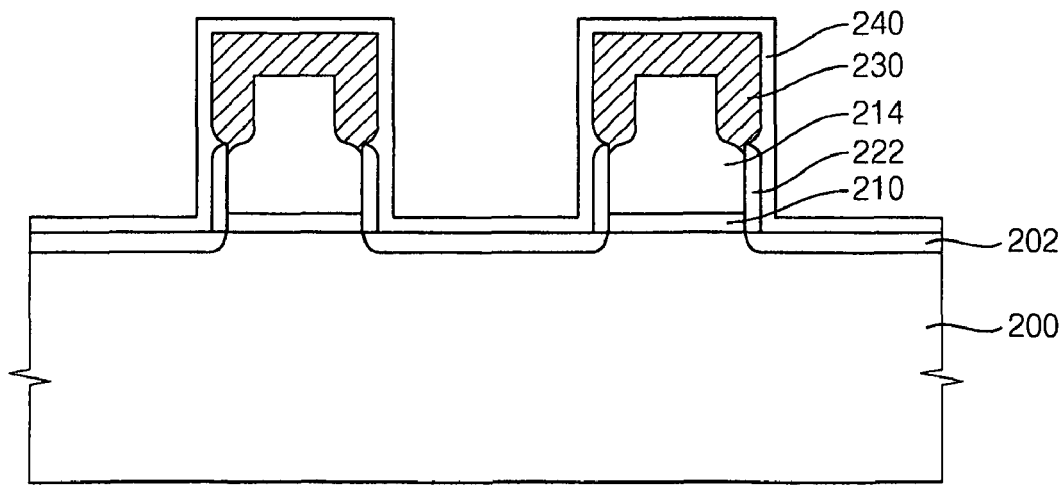

Referring to FIG. 16, a second insulation layer 240 is formed on the substrate 200 and the gate electrode 214. The second insulation layer 240 is patterned by a subsequent process to form a second spacer 242 (See FIG. 17). For example, the second insulation layer 240 can be formed using silicon nitride or silicon oxynitride by a chemical vapor deposition process.

Figure 17:
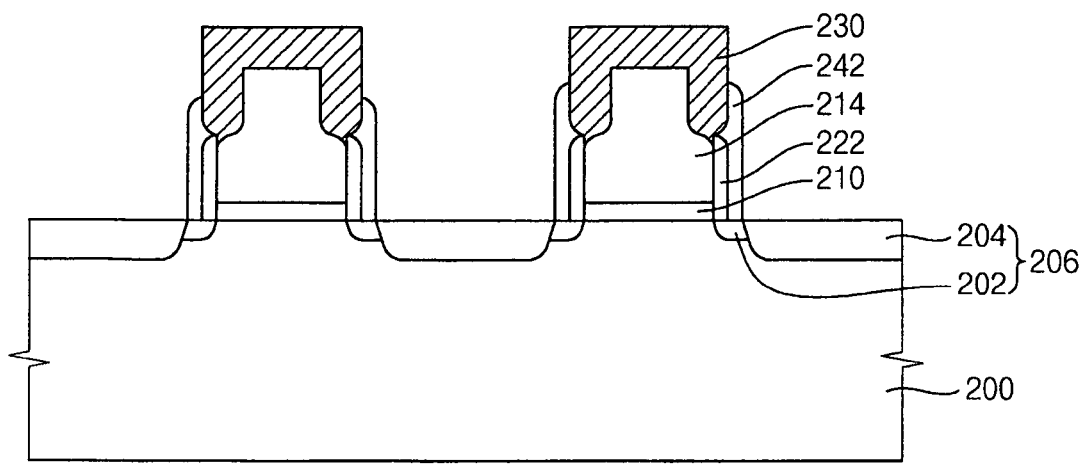

Referring to FIG. 17, the second insulation layer 240 is anisotropically etched to form the second spacer 242 that exposes an upper portion of the protecting layer 230. That is, the second spacer 242 is formed on the first spacer 222 and a sidewall of the protecting layer 230. During an etching process for forming the second spacer 242, the portion of the second insulation layer 240 that lies on the substrate 200 is contemporaneously removed. In some example embodiments, as process conditions of the etching process for forming the second spacer 242, such as an etching rate, an etching gas or etching solution and an etching time can be properly controlled, the second insulation layer 240 on the upper portion of the protecting layer 230 can be efficiently removed. Thus, the second spacer 242 is formed only at a side of or on the first spacer 222 and the sidewall of the protecting layer 230, and the upper portion of the protecting layer 230 is exposed by the second spacer 242.

Impurities are implanted into the substrate 200 exposed between the gate electrodes 214 on which the second spacer 242 is formed to form a second impurity region 204 having a high impurity concentration. Accordingly, an impurity region 206 including the first impurity region 202 and the second impurity region 204 is formed in the substrate 200 to be provided as a source/drain region of an LDD structure.

Figure 18:
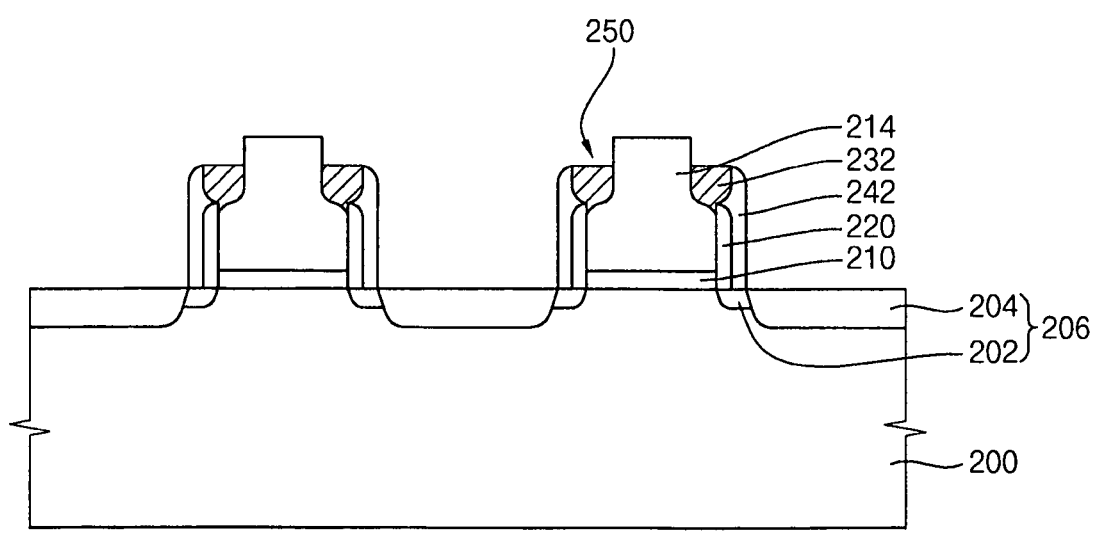

Referring to FIG. 18, the upper portion of the protecting layer 230 exposed by the second spacer 242 is partially removed to form a protecting layer pattern 232 on the central sidewall of the gate electrode 214. In one embodiment, the protecting layer pattern 232 can be formed by a wet etching process. For example, the protecting layer 230 can be partially removed using an etching solution including hydrogen fluoride (HF). In this case, silicon oxide that is formed on the substrate 200 between the gate electrodes 214 is contemporaneously removed by the etching process for forming the protecting layer pattern 232.

Thus, a first gate structure 250 including the gate insulation layer pattern 210 on the substrate 200, the gate electrode 214 on the gate insulation layer pattern 210, the first spacer 222 on the lower sidewall of the gate electrode 214, the protecting layer pattern 232 on the central sidewall of the gate electrode 214, and the second spacer 242 on the sidewall of the first spacer 222 and the sidewall of the protecting layer pattern 232 is formed.

Figure 19:
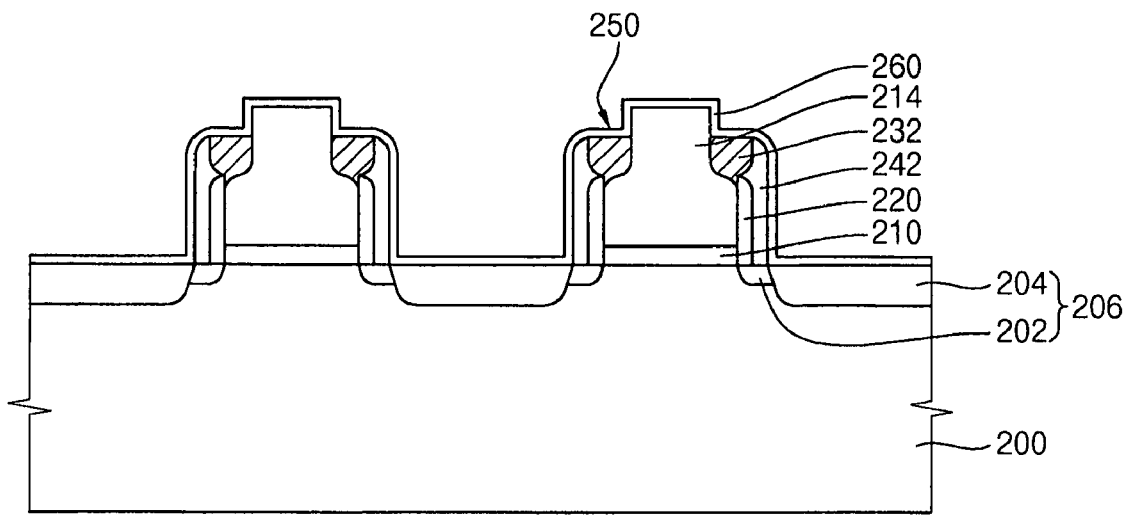

Referring to FIG. 19, a metal silicide pattern 262 (See FIG. 20) can be further formed on the gate electrode 214 exposed by the protecting layer pattern 232 and the impurity region 206 to improve conductivity of the gate electrode 214. However, the details of the process of forming the metal silicide pattern 262 are well known in the art and can be omitted in this example for simplification. For example, a metal layer 260 can be formed on the gate electrode 214 and the substrate 200 using a metal having a high melting point, such as cobalt (Co), nickel (Ni), platinum (Pt), palladium (Pd) or titanium (Ti), and then the substrate 200 in which the metal layer 260 is formed is thermally treated to form the metal silicide pattern 262.

In another example embodiment, a capping layer (not illustrated) can be further formed on the metal layer 260 to prevent a surface of the metal layer 260 from oxidizing during a subsequent thermal treatment process. For example, the capping layer can be formed using titanium (Ti) and/or titanium nitride (TiNx). However, the details of the process of forming the capping layer, can be omitted for simplification.

Figure 20:
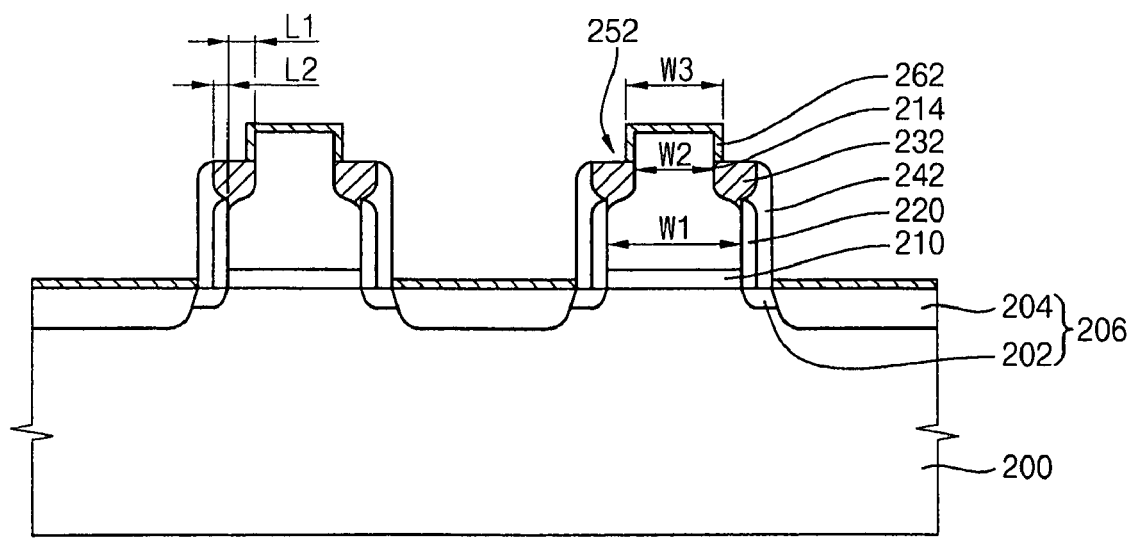

Referring to FIG. 20, the unreacted metal layer 260 is removed to complete the metal silicide pattern 262 on the gate electrode 214 exposed by the protecting layer pattern 232 and the impurity region 206. For example, the unreacted metal layer 260 can be removed by a stripping process.

By the above-mentioned processes, a second gate structure 252 including the gate electrode 214 is formed on the substrate 200. The gate electrode 214 includes the lower portion having the first width (W1), the central portion having the second width (W2) substantially smaller than the first width (W1) and the upper portion having a third width (W3). Here, the upper portion of the gate electrode 214 includes the metal silicide pattern 262, and thus the upper portion of the gate electrode 214 has the third width (W3) substantially smaller than the first width (W1) and substantially greater than the second width (W2).

Figure 21:
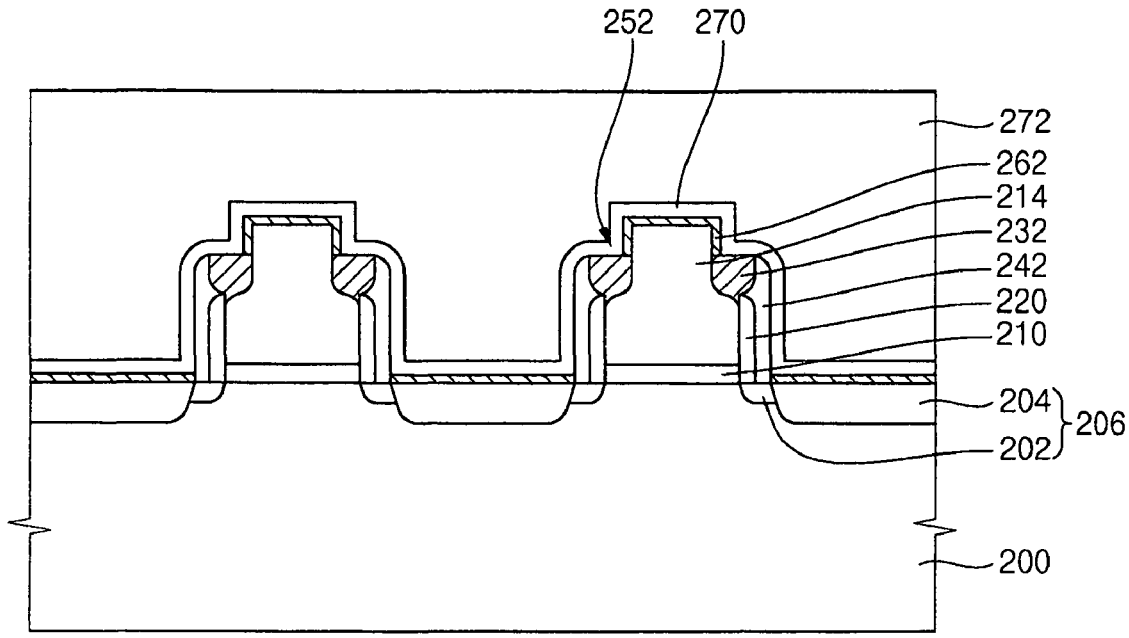
FIGS. 21 and 22 are cross-sectional views illustrating a method of manufacturing a semiconductor device including a gate structure in accordance with example embodiments.
Figure 22:
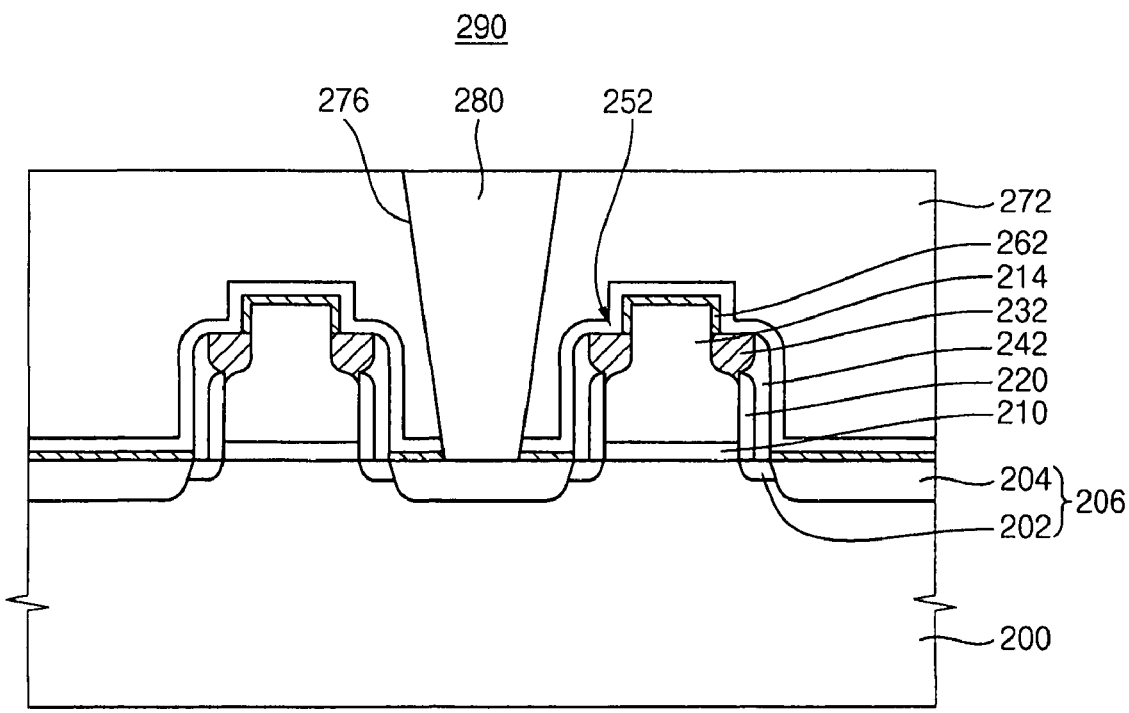

FIGS. 21 and 22 are cross-sectional views illustrating a method of manufacturing a semiconductor device including a gate structure in accordance with example embodiments. In FIGS. 21 and 22, processes of forming the gate structure 252 on the substrate 200 are substantially the same as or substantially similar to those described with reference to FIGS. 14 to 19.

Referring to FIG. 21, after forming the gate structure 252 on the substrate 200, an etch stop layer 270 is formed on the second gate structure 252 and the substrate 200. The etch stop layer 270 can be formed conformally on sidewalls and an upper surface of the second gate structure 252, for example using silicon nitride by a chemical vapor deposition process.

An insulation interlayer 272 is formed to cover the second gate structures 252, completely filling a gap between the second gate structures 252. An upper surface of the insulation interlayer 272 can be planarized by a planarization process such as a chemical mechanical polishing process and/or an etch-back process. The insulation interlayer 272 can be formed, for example, using silicon oxide by a chemical vapor deposition process.

Referring to FIG. 22, after the insulation interlayer 272 is partially etched to form a contact hole 276 that exposes the impurity region 206, a plug 280 is formed in the contact hole 276 to be connected to the impurity region 206. Thus, a semiconductor device 290 including the gate structure 252 on the substrate 200, the impurity region 206 formed in the substrate between the gate structures 252 and the plug 180 electrically connected to the impurity region 206 is completed.

In a conventional semiconductor device, since a distance between adjacent or neighboring gate electrodes is reduced in accordance with a reduction of the fabrication design rule, and thus, an alignment margin of the plug is decreased, shorting problems between the plug and the gate electrode can frequently occur. However, according to example embodiments, the upper portion of the gate electrode 214 has a width smaller than the lower portion of the gate electrode 214, and the central portion of the gate electrode 214 is covered with the protecting layer pattern 232. Accordingly, even though the gate electrodes 114 are arranged to be spaced apart from each other by a reduced distance, the plug 280 can be prevented from contacting the gate electrode 214, to thereby prevent shorting problems between the gate electrode 214 and the plug 280.

According to example embodiments, because the gate electrode where the upper portion of the gate electrode has a width substantially smaller than the lower portion of the gate electrode is provided, and because the protecting layer pattern is formed on the central sidewall of the gate electrode, even though the contact or the plug is positioned between the gate electrodes that are spaced apart from each other by a reduced distance according to a reduction of the fabrication design rule, the plug can be prevented from contacting the gate electrode, to thereby improve the resulting reliability of the semiconductor device that includes the gate electrode and the plug.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A gate structure comprising:
    a gate insulation layer pattern on a substrate;
    a gate electrode on the gate insulation layer pattern, the gate electrode including a lower portion having a first width, a central portion having a second width smaller than the first width, and an upper portion having a third width;
    a first spacer on a lower sidewall of the gate electrode;
    a protecting layer pattern on a central sidewall of the gate electrode to expose the upper portion of the gate electrode, the central sidewall of the gate electrode being exposed by the first spacer; and
    a metal silicide pattern surrounding the exposed upper portion of the gate electrode,
    wherein the upper portion and the central portion of the gate electrode comprise silicon, and the protecting layer pattern comprises silicon oxide.

2. The gate structure of claim 1, wherein the third width of the upper portion of the gate electrode is smaller than the first width, and the third width is greater than or equal to the second width.

3. The gate structure of claim 1, further comprising a second spacer on the first spacer and the protecting layer pattern.

4. The gate structure of claim 1, wherein the protecting layer pattern has a width greater than that of the first spacer.

* * * * *